United States Patent [19]

Bock et al.

[11] 4,189,690
[45] Feb. 19, 1980

[54] RESONANT LINEAR FREQUENCY MODULATOR

[75] Inventors: George F. Bock, Fountain Valley; Bernard L. Walsh, Jr., Northridge, both of Calif.

[73] Assignee: Hughes Aircraft Company, Culver City, Calif.

[21] Appl. No.: 910,805

[22] Filed: May 30, 1978

[51] Int. Cl.² ............................................. H03C 3/22
[52] U.S. Cl. .............................. 332/30 V; 331/117 D
[58] Field of Search ......... 332/16 T, 18, 22, 27–30 V; 331/117 V, 36 C

[56] References Cited

U.S. PATENT DOCUMENTS 3,961,286  6/1976  Kim ............................ 332/30 V X

OTHER PUBLICATIONS

IEEE Transactions on Microwave Theory and Techniques, Mar. 1969, p. 144.

*Primary Examiner*—Siegfried H. Grimm
*Attorney, Agent, or Firm*—Elliott N. Kramsky; W. H. MacAllister

[57] ABSTRACT

A circuit which modulates an r.f. carrier to produce an FM signal having a substantially linear frequency relation to an applied modulating voltage over a selected deviation bandwidth. An r.f. oscillator having an output matching circuit supplies the carrier to a modulator. The impedance of the oscillator is adjusted by the matching circuit to present a desired reactive mismatch to the modulator over the bandwidth. The modulator includes a pair of voltage dependent reactive impedance elements, oppositely biased and separated by a quarter wavelength line which acts as an impedance inverter. A modulating voltage applied to both of the elements causes a reactive imbalance therebetween, affecting either a net inductive or capacitive change in the load impedance presented to the oscillator. The center frequency of the circuit reacts in a substantially linear manner to the modulating voltage over the deviation bandwidth.

8 Claims, 9 Drawing Figures

RESONANT LINEAR FREQUENCY MODULATOR

BACKGROUND OF THE INVENTION

The present invention relates generally to systems for producing a frequency modulated signal and more particularly to means for directly modulating an r.f. carrier to achieve substantially distortion-free FM within a given deviation bandwidth.

In almost all frequency modulated oscillators there exists the requirement that the carrier be set to a precise frequency and then deviated linearly over the peak deviation bandwidth. Among other desirable properties, such a linear response minimizes signal distortion. At present, the standard method by which an oscillator's frequency is set and then deviated is by means of a tank circuit having a voltage variable capacitor (varactor). The modulating voltage applied to the tank circuit causes a variation in the capacitive value of the varactor and hence a corresponding variation in the resonant frequency of the tank circuit. The resonant frequency of the circuit is related to its capacitance in a non-linear manner and the varactor voltage-capacitance characteristic is also known to be non-linear. It can be shown that the resultant center frequency response of the oscillator to an applied modulating voltage waveform is inherently non-linear for all deviation bandwidths. Thus, it is presently a difficult task to deviate a carrier linearly over an FM bandwidth with existing components and tank circuit designs without external compensation or special varactor diodes. External compensation often introduces additional and burdensome system complexity and cost.

SUMMARY

It is therefore a principal object of the present invention to provide means for directly modulating an r.f. carrier to produce a frequency modulated signal exhibiting a substantially linear frequency response to an applied modulating voltage within a selected deviation bandwidth.

A more specific object of this invention is to provide an r.f. circuit whose resonant frequency is a substantially linear function of an applied modulating voltage over a desired deviation bandwidth.

A further specific object of this invention is to provide a substantially linear modulation circuit in microstrip whereby many of the common mechanical, temperature and modulation frequency sensitivity problems that are present in cavity-type oscillators are minimized and/or eliminated.

These and other objects of the invention are attained in one embodiment of the present invention by means of a modulator having a pair of oppositely biased varactor diodes with a quarter wavelength line interposed therebetween. The quarter wavelength line serves as an impedance inverter to enable the modulator to present a reactive change in impedance to an r.f. carrier generator in response to a modulating voltage.

The modulator may be configured as the load impedance of a circuit including an r.f. oscillator having an output matching circuit. The matching circuit is designed in conjunction with the other oscillator elements for a low Q value so that the center frequency of the circuit is sensitive to reactive changes in the impedance of the modulator. The entire circuit may be constructed in microstrip to eliminate many of the common mechanical and temperature problems that are present in cavity-type oscillators.

The above-mentioned and other features and objects of this invention and the manner of obtaining them will become more apparent and the invention itself will be best understood by reference to the following description of a preferred embodiment of the invention taken in conjunction with the accompanying drawings, wherein:

DESCRIPTION OF THE PREFERRED EMBODIMENT

Figure 1:
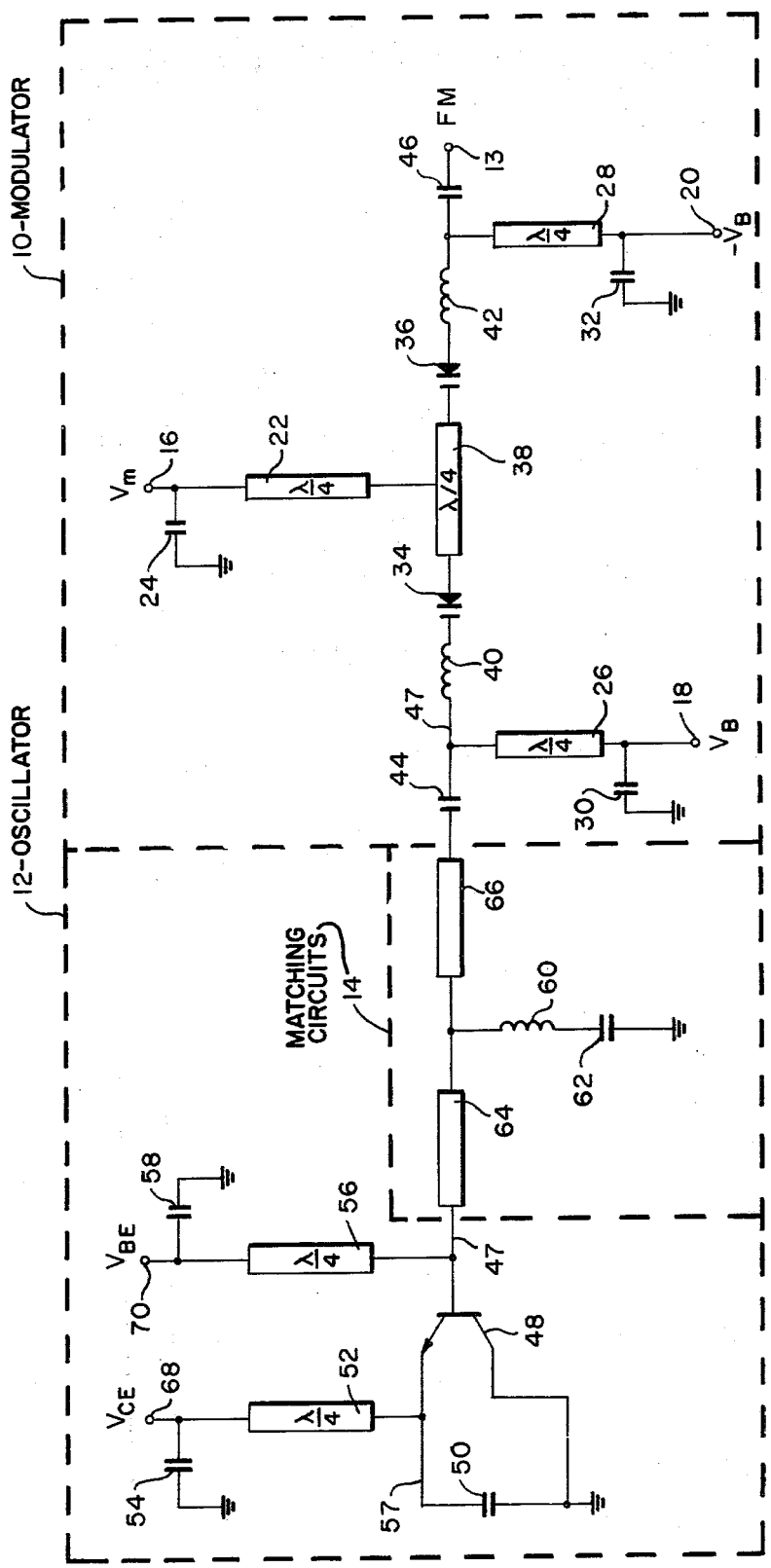
FIG. 1 is a circuit diagram of the present invention utilized in conjunction with a bipolar oscillator.

Turning now to the drawings, there is shown in FIG. 1 a circuit diagram of an embodiment of the present invention. The modulator 10 acts in conjunction with an r.f. oscillator 12 to produce an FM signal at the output 13. The voltage controlled oscillator exhibits a substantially linear frequency response to the modulating signal $V_M$ over a preselected deviation bandwidth. An output matching circuit 14 of the oscillator 12 interfaces with the modulator 10 for the setting of the resonant or center frequency of the oscillator 12 to a high degree of accuracy and provides a desired reactive mismatch with the linear modulator 10 over the selected bandwidth.

The modulating voltage waveshape $V_M$ is applied to the system at the port 16 of the modulator 10. (Varactor) dc bias voltages are applied to the linear modulator 10 at the (positive) bias input 18 and at the (negative) bias input 20. The bias voltages applied are substantially identical and opposite in sign and serve to back bias the varactors 34 and 36, respectively. The capacitor 44 serves as a dc block to maintain the bias applied at the (positive) input 18 and the capacitor 46 serves to maintain the (negative) bias at the input 20. The r.f. inductors 40 and 42 are provided to allow the individual resonating of the varactor 34 and the varactor 36, respectively. That is, the inductors allow the adjustment of the reactance-versus-modulating voltage characteristic so that an identical or proportionally desirable reactance response to the applied modulation voltage $V_M$ may be obtained by each of the above-mentioned inductor and varactor combinations in conjunction with the varactor dc bias voltages. Although the invention as illustrated and described herein utilizes voltage dependent capacitors or varactors it will be readily appreciated by those skilled in the art that other voltage dependent reactive elements might be equally utilized herein in consonance with the theoretical basis of the present invention. Accordingly, all such alternatives are within the scope of the present invention. The invention has been successfully operated with parallel inductor-varactor combinations and such alternate configuration is also within the scope of the invention herein.

The varactors 34, 36 are semiconductor diodes whose capacitance is varied by a variation in bias voltage applied thereto. As is well known, diodes of this type consist of a p zone having positive carriers corresponding to the anode end, an n zone having negative carriers corresponding to the cathode end, and a thin depletion zone or junction between the two other zones with relatively few carriers therein. When a potential is applied to one of these diodes which is positive at the anode end and negative at the cathode, carriers act to bridge the depletion zone to form a conducting path through the diode. When the applied potential is reversed, the depletion zone reappears and insulates the two zones of the diode from each other which is known as a back-biased condition. It is primarily in this back-biased condition that the diode acts as a variable capacitance. A back-biased potential across the diode causes the carriers to be pulled away from the depletion zone. The greater the potential applied in a back-biased direction across the diode, the further the carriers are pulled away from the depletion zone and the lower is the capacitance of the diode due to the effective larger width of the depletion zone.

A quarter wavelength line 38 is interposed between the varactors 34 and 36. As will be seen, the line 38 serves as an impedance inverter. That is, the resultant reactance of all components to the right thereof is reversed in phase by ninety degrees when presented as a load impedance to the r.f. oscillator 12. This property of a high frequency quarter wavelength line such as the line 38, well known in the art, constitutes an enabling feature of the present invention.

R.f. energy is transferred from the oscillator 12 to the modulator 10 along the circuit branch 47. The r.f. energy is protected from dissipation with low impedance supplies by the positioning of shunt capacitance and quarter wavelength line combinations which act as r.f. chokes between the various supplies and the branch 47. That is, within the modulator 10 the bias and modulation voltage supplies ae insulated from r.f. energy in the circuit branch 47 by the quarter wavelength line 22 and shunt capacitance 24 interposed between the quarter wavelength line 38 and the modulation port 16 (it is to be noted that the modulating voltage is of relatively low frequency); the quarter wavelength line 26 and shunt capacitance 30 are interposed between the positive bias terminal 18 and the circuit branch 47; and the quarter wavelength line 28 and shunt capacitance 32 are interposed between the negative bias voltage supply and the circuit branch 47.

Figure 2:
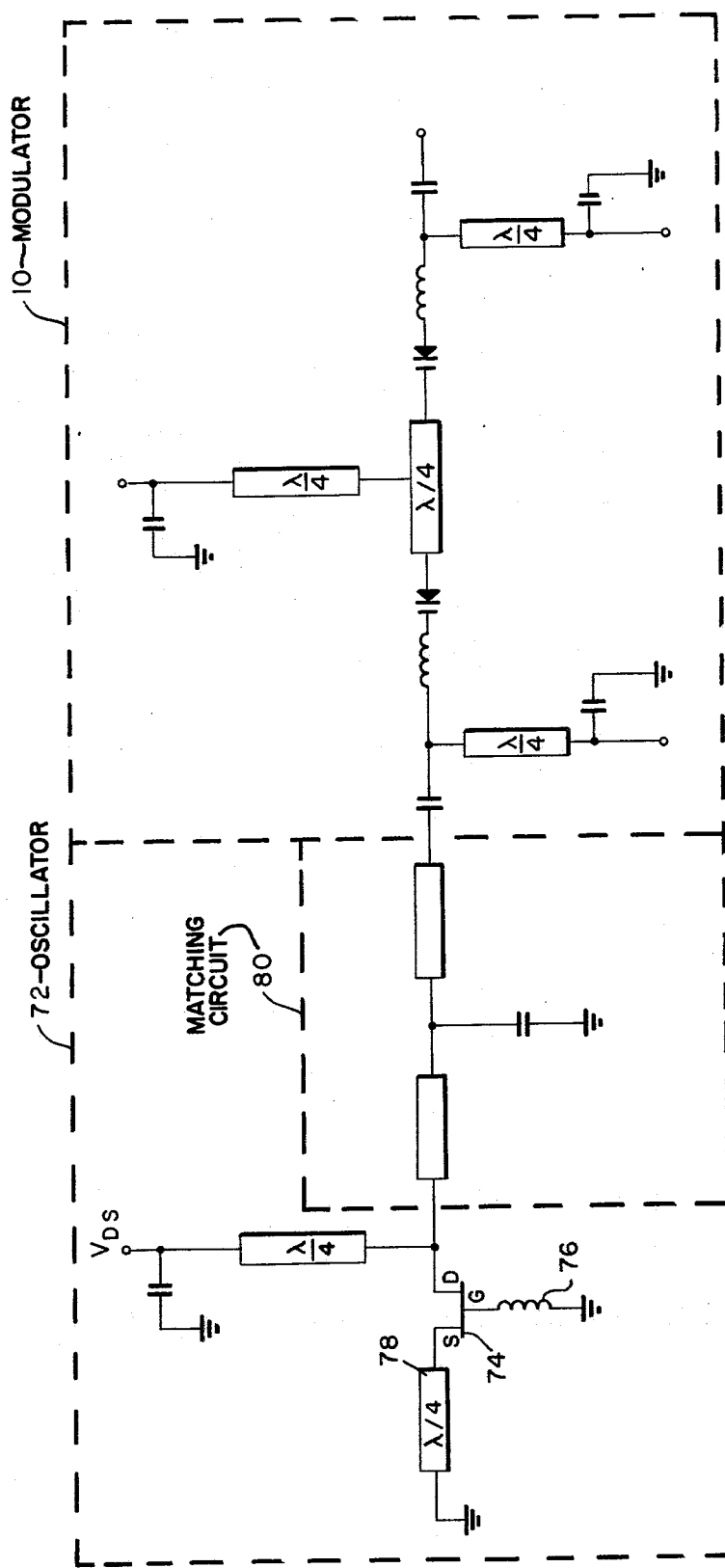
FIG. 2 is a circuit diagram of the present invention utilized in conjunction with a unipolar oscillator.

The r.f. oscillator 12 employed in the embodiment of FIG. 1 is of a conventional design utilizing a bipolar transistor 48 in the common collector configuration. It will be seen that, for the purpose of the present modulation system, any low Q oscillator having the desired center frequency may be adapted to operation in conjunction with the present invention. An oscillator utilizing a unipolar transistor adapted for use with the present invention is shown in FIG. 2. This configuration will be discussed infra.

The common collector configuration of FIG. 1 has been chosen for design purposes to take advantage of the ease with which the feedback necessary to produce a low Q negative resistance can thereby be accomplished. However, the present invention is by no means limited to such configuration. The feedback capacitor 50 of the oscillator 12 of FIG. 1 is interposed between the emitter of the transistor 48 and ground. Its value determines the oscillatory frequency range of the oscillator 12. This is well known in the art and for the particular oscillator 12 shown may also be considered the range of negative resistance. The transistor 48 bias voltages $V_{CE}$ and $V_{BE}$ are supplied at the input 68 and at the input 70. Just as in the above-described biasing of the modulator 10, r.f. chokes are utilized to protect the dissipation of r.f. energy through the oscillator bias supplies. The quarter wavelength line 52 in conjunction with the shunt capacitance 54 shields the r.f. energy in the emitter circuit branch 57 from the collector-emitter bias supply while the quarter wavelength line 56 acts in conjunction with the shunt capacitance 58 to provide an open circuit to r.f. energy in the circuit branch 47. (All shunt capacitors additionally act as blocks to preserve proper biasing with the system).

The output matching circuit 14 of the oscillator 12 interlies the base of the transistor 48 and the modulator 10. The matching circuit 14 allows adjustment of the reactive impedance looking into the oscillator 12 over the desired deviation bandwidth so that the resonant frequency of the entire circuit will be sensitive to reactive changes in the impedance presented by the modulator 10. The inductor 60 provides inductance at r.f. within the oscillator 12. The capacitor 62 acts as a dc block to preserve the proper biasing of the oscillator 12. Thus, the effect at r.f. of the matching circuit 14 depends upon the value of the inductor 60 in conjunction with the impedance of microstrip lines 64 and 66 of the circuit branch 47. These three elements, in conjunction with the feedback capacitor 50, essentially determine the reactive component of the generator impedance of the oscillator 12 within the frequency bandwidth of interest. By methods well known in the art, including but not limited to the use of S parameters as described by Richard W. Anderson on pages 3–9, 3–10 of *S-Parameters . . . Circuit Analysis and Design: Hewlett-Packard Journal Application Note* 95, Hewlett-Packard Company (1968), it is possible to choose these elements so that, in conjunction with the other elements of the oscillator 12, the circuit will oscillate (with proper choice of the feedback capacitor 50) over the desired bandwidth. Additionally, by these and other methods well known in the art, the reactive value of the generator impedance of the oscillator 12 may be maintained within a range that will not mask variations in the reactive value of the impedance of the modulator 10 with regard to the setting of the resonant frequency of the system. In other words, these parameters may be adjusted to arrive at a low Q oscillator 12 sensitive to impedance variations in the modulator 10.

The modulator 10 of the present invention is operationally compatible with any low Q oscillator in the appropriate frequency bandwidth. In FIG. 2 there is shown the linear modulation circuit 10 adapted to operation with an oscillator 72 which utilizes a unipolar transistor 74 in the common gate configuration. The r.f. inductor 76 interposed between the gate and ground determines the oscillatory bandwidth while the quarter wave line 78 sets the center frequency. The oscillator 72 is so configured that, in conjunction with its matching circuit 80, a low Q circuit is achieved with proper reactive mismatch over the desired FM bandwidth. The common gate was chosen over the common source oscillator due to the ease with which the low Q may be achieved. Additionally, in this configuration, very little matching must be done at the drain port of the transistor 74, allowing the oscillator 72 to see the full impact of the reactive change in the modulator 10.

Returning now to the system of FIG. 1, in operation the (unmodulated) center frequency of the oscillator 12 is set by the application of the appropriate dc bias at the inputs 68 and 70 in conjunction with the value of the feedback capacitor 50 and the elements of the output matching circuit 14. As mentioned above, the value of the feedback capacitor 50 additionally determines the frequency bandwidth of oscillation while, in conjunction with the elements of the output matching circuit 14, it determines the range of reactance values of the generator impedance of the oscillator 12 over the desired FM bandwidth. When no modulation is applied to the system at the modulation port 16, the modulator 10 presents no reactive impedance to the oscillator 12 (viewing the oscillator 12 as a generator feeding a load impedance consisting of the modulator 10). The lack of a reactive component results from the fact that, in such a situation, equal reverse biases are applied to the first varactor 34 and to the second varactor 36 of the modulator 10. Theoretically, each varactor being a voltage controlled capacitor, an equal amount of capacitive reactance is developed through each of the varactors absent modulation. The inductors 40 and 42 are not necessarily required but, as mentioned above, have been added to assure (provide an added degree of freedom or "tuning") the desired reactance-versus-modulating voltage characteristic on either side of the quarter wavelength line 38.

The quarter wavelength line 38 acts as an impedance inverter. Thus, when considering the linear modulation circuit 10 as a load impedance, a capacitance due to the combination of the second varactor 36 and the second inductor 42 appears inductive. Due to the assumed equality of the reactances on either side of the quarter wavelength line 38 absent modulation, zero net reactance is presented to the oscillator 12. Therefore, the center frequency of the oscillator 12 is unaffected by the presence of the modulator 10 when no modulating voltage $V_M$ is applied to the system.

When a modulating voltage $V_M$ is applied, a reactive imbalance is caused to exist at opposite ends of the quarter wavelength line 38. When the instantaneous value of the modulating voltage is positive, the first varactor will be back biased by a lesser amount than it was when no modulation was present and the second varactor 36 will be back biased by a greater amount in a "push-pull" manner. This will cause the effective capacitance of the modulator 10 to the left of the quarter wavelength line 38 to be greater than that to the right due to the nature of the voltage-capacitance characteristic of a varactor. The greater capacitive value of the first varactor 34 will be seen by the oscillator 12, when the modulator 10 is viewed as a load impedance, as a new capacitive load. The introduction of this capacitive reactance causes the system consisting of the oscillator 12 and the modulator 10 to resonate at a frequency somewhat different from the unmodulated center frequency of the oscillator 12. Conversely, a negative going value of modulating voltage will back bias the first varactor 34 to a greater extent than it will the second varactor 36. The net effect will be to present an inductive reactance to the oscillator 12. As mentioned supra, the oscillator 12, including the matching circuit 14, has been designed for low Q. The reactive impedance mismatch at a new resonance off the center (carrier) frequency within the FM bandwidth of interest is designed to be sufficiently small that the center frequency of the system is sensitive to that reactive change in the impedance of the modulator 10. As will be seen from the results and analysis infra, the present invention includes sufficient degrees of freedom in design that a substantially linear relationship may be achieved between the value of modulating voltage $V_M$ applied and the variation of resonant frequency over a preselected bandwidth.

Figure 3:
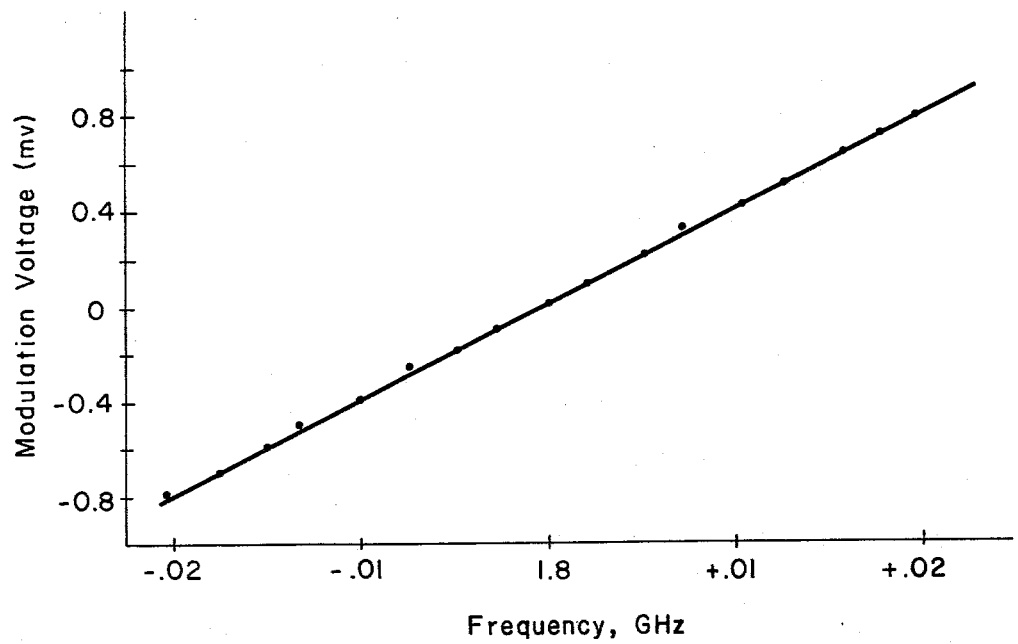
FIG. 3 presents the modulation (frequency vs voltage) characteristic of a 1.8 GHz linear modulation circuit configured according to the embodiment of FIG. 1.
Figure 4:
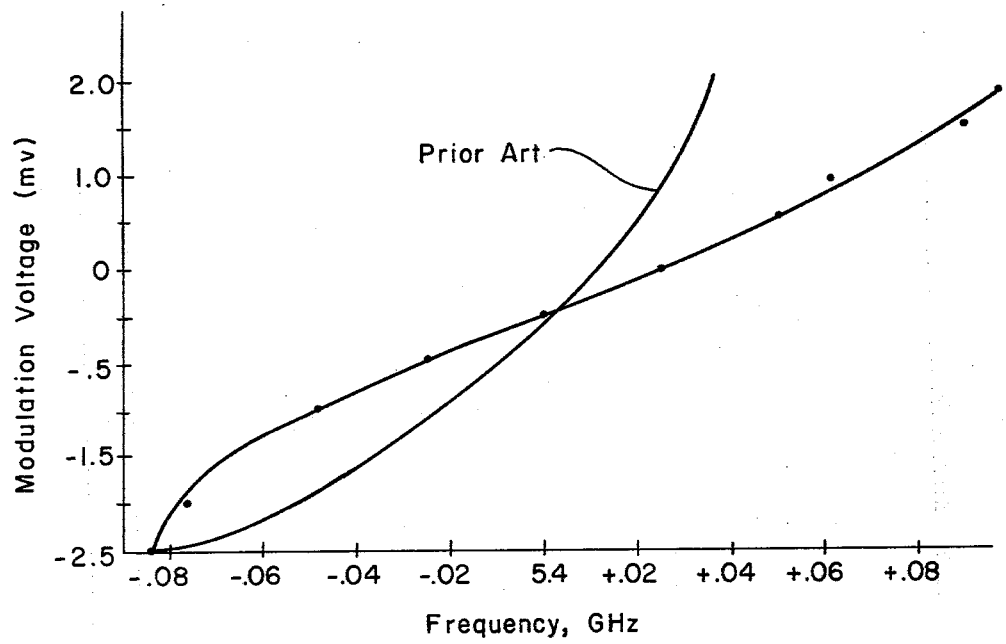
FIG. 4 presents the modulation (frequency vs voltage) characteristics of a 5.4 GHz linear modulation circuit configured according to the embodiment of FIG. 2 and the like characteristic for a 5.4 GHz circuit configured according to the prior art.

Modulation achieved by means of the invention may be observed in FIGS. 3 and 4. In FIG. 3 there is shown a graph of measured static frequency versus dc modulation voltage for the invention employing a bipolar transistor oscillator in accordance with the embodiment of FIG. 1. It was designed for a center frequency of 1.8 GHz and a peak-to-peak deviation of 34 MHz ($\pm 17$ MHz). The 1.8 GHz oscillator utilized a NE 22055 gallium arsenide transistor produced by the Nippon Electric Company, Ltd. and a feedback capacitance of 3 pf. Both the oscillator and the modulator were constructed on one inch square alumina substrates using silicon tuning varactor diode chips. The graph of FIG. 4 presents the results for a unipolar oscillator configured according to FIG. 2 with a center frequency of 5.4 GHz and a peak-to-peak deviation of 100 MHz ($\pm 50$ MHz). Similar construction was employed, utilizing a NE 24400 unipolar transistor produced by Nippon Electric Company, Ltd.

A tradeoff exists between oscillator Q and excess noise that perturbs the frequency of oscillation, therefore, overall system requires dictate how low a Q is possible for a given oscillator. The Q as measured for both oscillators was on the order of 6. (Measurement of Q was performed by placing a known mismatch at the output of the oscillator and then recording the frequency shift.) The deviation ratio of the invention was found to be fairly insensitive to the frequency of the applied modulation voltage from dc to 150 MHz. The 1.8 GHz oscillator had a maximum variation in deviation sensitivity of less than 5 MHz/volt over the 150 MHz bandwidth.

The capacitance value of the varactors is a function of the Q of the oscillator, as a large enough reactive change must be produced in the modulator to pull the oscillator frequency in response to the applied modulation voltage $V_M$. The other factor to be considered in the selection of the varactors is breakdown voltage. The breakdown voltage must be large enough to provide proper back biasing with respect to the modulation voltage, additionally considering the r.f. voltage generated across the varactor.

Referring now to the results, it will be noted from FIG. 3 that the required deviation bandwidth and the frequency versus modulation voltage characteristic of the circuit according to FIG. 1 does not begin to lose linearity until the frequency deviaton is in excess of 40

Figure 5A:
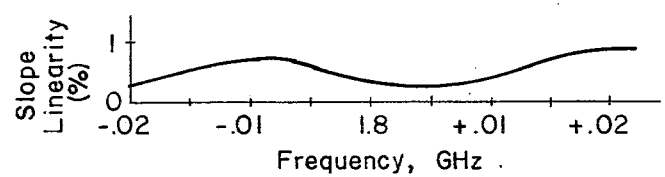
FIGS. 5(a) and 5(b) present the slope linearity and group delay characteristics of the 1.8 GHz linear modulation circuit configured according to the embodiment of FIG. 1.
Figure 5B:
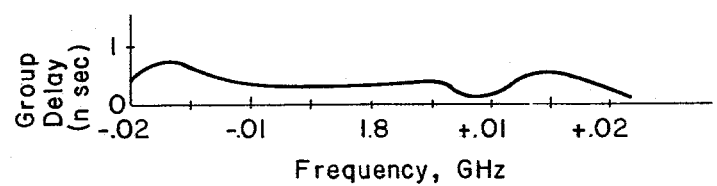

MHz. A graph of the slope linearity (an indication of the change in modulation sensitivity) and group delay (the nonlinear change in delay of the baseband signal) of the 1.8 MHz oscillator (for a deviation of ±20 MHz) is shown in FIGS. 5(a) and 5(b). Both of these characteristics are predictably minimized as a result of the substantial linearity of the frequency versus voltage characteristic of the present invention. It is seen from the graph of FIG. 5(a) that the peak-to-peak slope linearity change for the 40 MHz bandwidth is less than one percent. The peak-to-peak group delay change variation is approximately 0.5 nsec over the deviation bandwidth. The two parameters are direct causes of distortion in analog FM signals and of bit errors in digital FM systems. Typical maximum parameter specifications for satisfactory FM performance are (±) two percent and 2.5 nsec respectively. (The measurements of FIG. 3 were achieved by sweeping the oscillator with a 60 Hz sine wave of peak-to-peak amplitude sufficient to provide full deviation while at the same time modulating the carrier with a low level 500 kHz signal.)

Figure 6:
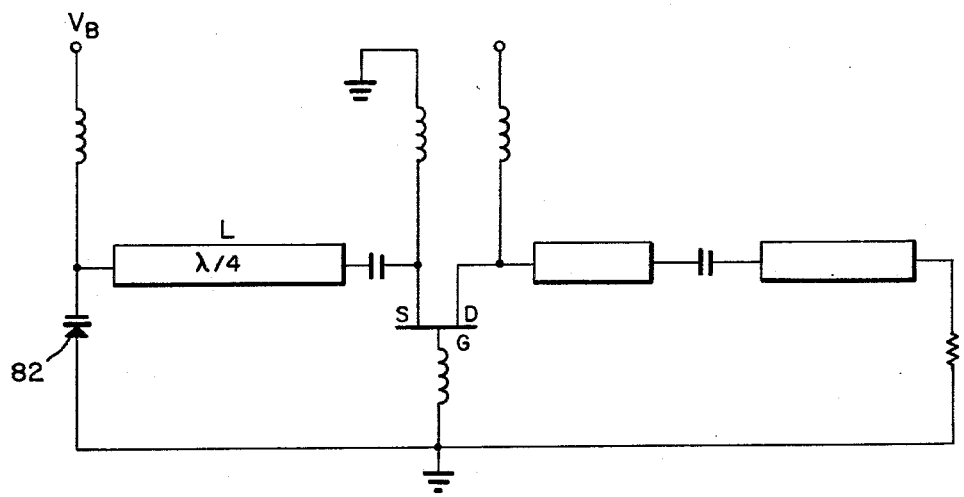
FIG. 6 is a circuit diagram of a typical prior art r.f. modulation circuit which utilizes a single varactor to provide a tank circuit of varying reactance.

In FIG. 4 there is shown a graph of static frequency versus dc modulation voltage for both an FET oscillator configured according to the present invention and that for the oscillator of FIG. 6. The oscillator of FIG. 6 is considered to be representative of conventional prior art oscillators utilizing a single varactor diode 82. The cause of the observed variation in FIG. 4 of linearity between the present invention and the prior art will become evident from the discussion to follow.

Therefore, in order that the present invention may be better understood, a brief analysis will now be given. It is to be understood, however, that this analysis is given merely for the purpose of exposition and in order that the invention may be more fully appreciated. While this analysis, incorporating, inter alia, confirmatory computer results, is believed to be correct, it is not of necessity complete, nor does the operation of the invention depend upon its accuracy or otherwise.

The prior art oscillator of FIG. 6 employs a tank circuit including a single voltage variable capacitor or varactor 82. Ignoring the bias lines and dc blocking capacitors for purpose of analysis at r.f., the resonant frequency of the tank circuit is:

$$f = 1/2\pi\sqrt{LC}$$

The well known varactor capacitance-versus-modulating (back bias) voltage characteristic is:

$$C = C_o/(1 + V/\phi)^n$$

Where $C_o$ is the unbiased varactor capacitance and $\phi$ and n represent physical characteristics of the varactor. Substituting for C in the above equation, $$f = \frac{1}{2\pi\sqrt{L}} \left[ \frac{(1 + V/\phi)^n}{C_o} \right]^{\frac{1}{2}}$$

Nominally, n may be considered equal to one-third. From the preceding equation it is seen that the tank circuit frequency is an inherently nonlinear function of the applied modulation (back bias) voltage V for the prior art modulation circuit utilizing a single varactor 82 as shown in FIG. 6. The predicted nonlinearity (assuming oscillator sensitivity to tank circuit reactance) of such a modulator is confirmed by the empirical results of FIG. 4.

An analysis of the invention shown in FIG. 1 and FIG. 2, although proceeding in a manner analogous to that yielding the above-confirmed prediction of nonlinearity of the prior art FM modulator of FIG. 6 involves a higher degree of mathematical complexity. Therefore a computer run of the resultant equation for frequency versus applied modulating voltage is necessitated to examine the analytical implications.

Figure 7:
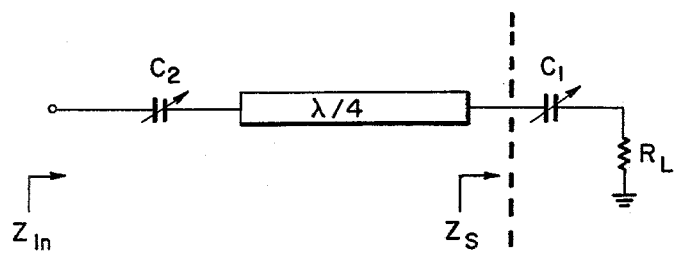
FIG. 7 is a simplified schematic diagram of the modulator of the present invention at r.f. for aid in the accompanying textual analysis thereof.

When the same simplifying assumptions are made with regard to the series inductance, bias lines and dc blocking capacitors of the circuits of FIGS. 1 and 2 as were made for purpose of analysis of the prior art circuit, the modulator is reduced to the circuit of FIG. 7, consisting of a quarter wavelength of transmission line separating two voltage variable capacitors (varactors). It is the variation in the reactive impedance $Z_{in}$ which the modulator presents to a low Q oscillator that deviates the center frequency of the entire circuit. By definition, the modulator of FIG. 7 is resonant at some unknown frequency where $I_m[Z_{in}]=0$. It can be shown that the reactive value of the input impedance of the modulator is:

$$\frac{-1}{\omega C_2} + \frac{(Z_o - 1/\omega C_1 \cotan \beta l)(\cotan \beta l + 1/\omega C_1 Z_o)}{(\cotan \beta l + 1/\omega C_1 Z_o)^2 + (R_L/Z_o)^2}$$
$$- \frac{R_L^2/Z_o^2 \cotan \beta l}{(\cotan \beta l + 1/\omega C_1 Z_o)^2 + (R_L/Z_o)^2}$$

where $Z_o$ = characteristic impedance of the transmission line, $\beta$ = phase constant l = length of transmission line The resonant frequency of the modulator may be found by setting the above expression to zero, $\omega = \omega_o$, and $\cotan \beta l$ to zero. To determine the variation of impedance for frequencies slightly off resonance, the value of $\cotan \beta l$ is approximated by $(\pi/4)(\Delta\omega/\omega_o)$. The value of $Z_o^2$ is approximated by $R_L^2 + (1/\omega_o C_1)^2$. Making these approximations, the reactive load impedance presented by a modulator, such as the modulator 10 of FIG. 1, to an oscillator for small deviations $\Delta\omega$ from the center frequency is:

$$\frac{-1}{(\omega_o - \Delta\omega)C_1} + \frac{1}{(\omega_o - \Delta\omega)C_2} + \frac{\pi}{4} \frac{1}{Z_o} \left( \frac{1}{\omega_o C_1} \right)^2 \frac{\Delta\omega}{\omega_o}$$

substituting the voltage varactor characteristic into the above equation, making the substitution $$\frac{V_i - V_{mi}}{\phi} = 1 + \overline{V_{mi}}$$

and setting $\phi = \frac{1}{3}$, the reactive impedance of the modulator as a function of an applied modulation voltage is found to be:

$$\frac{-(1 + (1 + \overline{V_{m1}}))^{\frac{1}{3}}}{(\omega_o - \Delta\omega)C_{01}} + \frac{(1 + (1 + \overline{V_{m2}}))^{\frac{1}{3}}}{(\omega_o - \Delta\omega)C_{02}}$$
$$+ \frac{\pi}{4Z_o} \left[ \frac{(1 + (1 - \overline{V_{m1}}))^{\frac{1}{3}}}{\omega_o C_{01}} \right]^2 \frac{\Delta\omega}{\omega_o}$$

Figure 8:
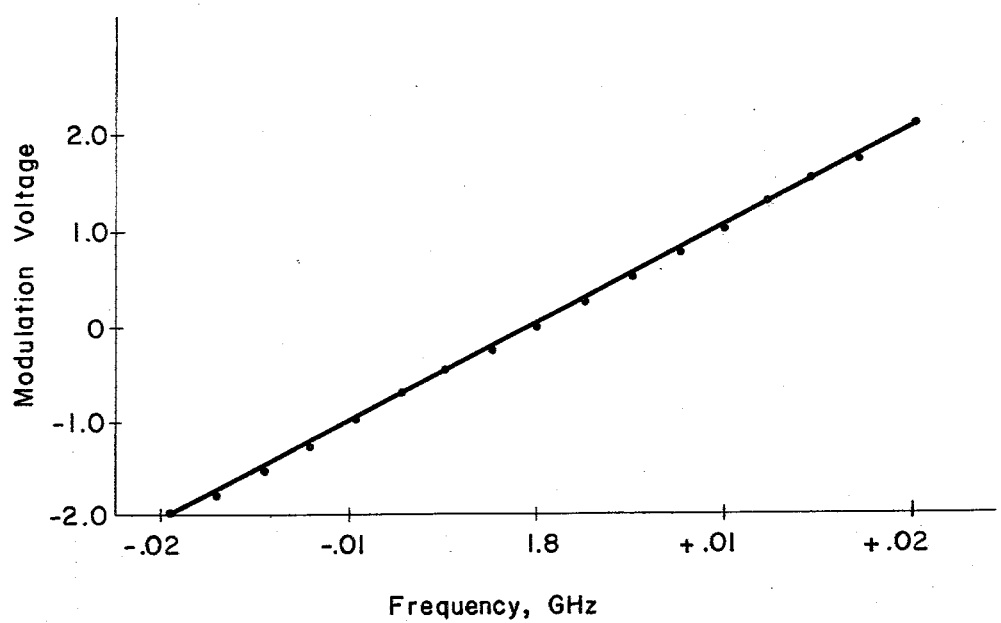
FIG. 8 is a graphical representation of the analytically derived modulation (frequency vs voltage) characteristic of the present invention in conformance with accompanying textual analysis.

FIG. 8 is a graph of modulation voltage versus resonant frequency derived from the preceding equation under the following additional assumptions:

$$C_{01} = C_{02}$$

$$\overline{V_{m1}} = \overline{V_{m2}}$$

The linearity which was experimentally shown in FIGS. 3 and 4 is thus analytically confirmed in the computer run results of FIG. 8. A difference in varactor characteristic capacitances $C_{0i}$ will not introduce nonlinearity. Rather, it can be shown to affect a shift in the linear curve. An imbalance in varactor characteristics due to inequality of the n parameters thereof will also leave the linearity unaffected, causing only a change in the slope of the substantially linear characteristic.

From the foregoing, it is seen that there has been brought to the art of frequency modulation a system for producing a frequency modulated signal exhibiting a substantially linear response to an applied modulating voltage within a selected deviation bandwidth. A voltage controlled oscillator or the like designed in accordance with the present invention will produce a relatively distortionless FM output of relatively stable deviation ratio over a broad range of modulation frequencies. Additionally, the fabrication of the circuit in microstrip allows the circuit to operate substantially unperturbed by common mechanical and temperature effects.

By means of a system incorporating the invention one may obtain substantially distortion-free FM over a preselected deviation bandwidth without the introduction of complex and costly external compensation.

What is claimed is:

1. A frequency modulation system comprising in combination:
   (a) means for generating an r.f. carrier, said means having an output port and including an output matching circuit being so arranged that the reactive impedance of said means is maintained within a predetermined range of values for a predetermined deviation of the frequency of said r.f. carrier;
   (b) means for modulating said r.f. carrier with a voltage, said means having a first input port, a second input port and an output port, said first input port being in electrical connection with the output port of said means for generating an r.f. carrier whereby said r.f. carrier is applied as a first input to said means for modulating said r.f. carrier and said second input port being adapted to receive said modulating voltage whereby said voltage is applied as a second input to said means for modulating said r.f. carrier, so that there is produced at the output port of said means for modulating said r.f. carrier said r.f. carrier frequency modulated by said voltage; and
   (c) said means for modulating said r.f. carrier comprising (1) first circuit means in electrical connection with the first input port, and (2) second circuit means in electrical connection with the output port of said means for modulating and (3) impedance inversion means in electrical connection with and positioned between said first circuit means and said second circuit means and further connected to said second input port, said first circuit means and said second circuit means each being further characterized in that its reactive impedance is a function of said modulating voltage and wherein the resonant frequency of said frequency modulation system comprising said means for generating and said means for modulating said r.f. carrier exhibits a substantially linear response to the value of the modulation voltage over said predetermined frequency deviation.

2. A frequency modulation system as identified in claim 1 further characterized in that said first circuit means and said second circuit means are voltage variable capacitors.

3. A frequency modulation system as defined in claim 1 further characterized in that said impedance inversion means comprises a quarter wavelength line.

4. A frequency modulation system as identified in claim 3 further characterized in that said system is of microstrip fabrication.

5. A frequency modulator having a first input port, a second input port and an output port, said first input port being adapted to receive an r.f. carrier, and said second input port being adapted to receive a modulating voltage so that there is produced at said output port said r.f. carrier frequency modulated by said voltage, said frequency modulator comprising in combination:
   (a) first circuit means in electrical connection with said first input port;
   (b) second circuit means in electrical connection with said output port; and
   (c) impedance inversion means in electrical connection with and positioned between said first circuit means and said second circuit means and further connected to said second input port, said first circuit means and said second circuit means each being further characterized in that its reactive impedance is a voltage dependent function whereby the reactive impedance of said modulator is a function of an applied modulation voltage.

6. A frequency modulator as identified in claim 5 further characterized in that said first and said second circuit means are voltage variable capacitors.

7. A frequency modulator as identified in claim 5 further characterized in that said impedance inversion means comprises a quarter wavelength line.

8. A frequency modulator as identified in claim 7 further characterized in that said modulator is of microstrip fabrication.

* * * * *